United States Patent
Choi et al.

(10) Patent No.: US 10,891,995 B2
(45) Date of Patent: Jan. 12, 2021

(54) COMMAND GENERATION METHOD AND SEMICONDUCTOR DEVICE RELATED TO THE COMMAND GENERATION METHOD

(71) Applicant: SK hynix Inc., Icheon-si (KR)

(72) Inventors: Geun Ho Choi, Icheon-si (KR); Seung Wook Oh, Yongin-si (KR); Jin Il Chung, Namyangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/518,635

(22) Filed: Jul. 22, 2019

(65) Prior Publication Data

US 2020/0227099 A1    Jul. 16, 2020

(30) Foreign Application Priority Data

Jan. 15, 2019    (KR) .................. 10-2019-0005339

(51) Int. Cl.
*G11C 7/22*     (2006.01)
*G11C 11/4094*  (2006.01)
*G11C 11/4076*  (2006.01)
*G11C 11/16*    (2006.01)

(52) U.S. Cl.
CPC .......... *G11C 7/222* (2013.01); *G11C 11/1675* (2013.01); *G11C 11/4076* (2013.01); *G11C 11/4094* (2013.01)

(58) Field of Classification Search
CPC . G11C 7/222; G11C 11/4076; G11C 11/1675; G11C 11/4094; G11C 29/42
See application file for complete search history.

(56) References Cited

U.S. PATENT DOCUMENTS

| | | | |
|---|---|---|---|
| 8,989,242 B2 * | 3/2015 | Takeuchi | H03M 13/091 375/219 |
| 2004/0221098 A1 * | 11/2004 | Ito | G11C 7/02 711/106 |
| 2018/0121355 A1 | 5/2018 | Berger et al. | |

FOREIGN PATENT DOCUMENTS

KR    1020180038341 A    4/2018

* cited by examiner

*Primary Examiner* — David Lam
(74) *Attorney, Agent, or Firm* — William Park & Associates Ltd.

(57) ABSTRACT

A semiconductor device and command generation method, the semiconductor device includes a command recovery circuit configured to receive a command from a plurality of commands, to store a code signal which is generated by encoding the received command from the plurality of commands, depending on the received command, and generate a plurality of internal commands by decoding a command code signal which is generated from the code signal after shifting the received command depending on a shifting control signal; and a memory circuit configured to perform an internal operation depending on the plurality of internal commands.

18 Claims, 13 Drawing Sheets

US 10,891,995 B2

COMMAND GENERATION METHOD AND SEMICONDUCTOR DEVICE RELATED TO THE COMMAND GENERATION METHOD

CROSS-REFERENCE TO RELATED APPLICATION

The present application claims priority under 35 U.S.C. § 119(a) to Korean Patent Application No. 10-2019-0005339 filed on Jan. 15, 2019 in the Korean Intellectual Property Office, which is incorporated herein by reference in its entirety.

BACKGROUND

1. Technical Field

Embodiments of the disclosure may generally relate to a command generation method related to the generation of internal commands, and a semiconductor device related to the command generation method.

2. Related Art

In a semiconductor device, a command and an address are inputted in synchronization with a clock. In a DDR (double data rate) synchronous semiconductor device, a command and an address are inputted in synchronization with the rising edge and the falling edge of a clock. In an SDR (single data rate) synchronous semiconductor device, a command and an address are inputted in synchronization with the rising edge of a clock.

A semiconductor device is realized to include a plurality of ranks which share input/output lines, and performs an on-die termination (ODT) operation to prevent the reflection of the signals of the shared input/output lines. Thus, commands for controlling the on-die termination (ODT) operation are added.

SUMMARY

In an embodiment, a semiconductor device may include: a command recovery circuit configured to receive a command from a plurality of commands, to store a code signal which is generated by encoding the received command from the plurality of commands, depending on the received command, and generate a plurality of internal commands by decoding a command code signal which is generated from the code signal after shifting the received command depending on a shifting control signal; and a memory circuit configured to perform an internal operation depending on the plurality of internal commands.

In an embodiment, a semiconductor device may include: a summed command generation circuit configured to generate a summed command by summing first to fourth commands; a command code signal generation circuit configured to generate first and second code signals by encoding the first to fourth commands, store the first and second code signals by the summed command, and generate first and second command code signals from the first and second code signals after a second shifting time; and an internal command generation circuit configured to generate first to fourth internal commands by decoding the first and second command code signals, after shifting the summed command to a first shifting time.

In an embodiment, a command generation method may include: generating a summed command which is enabled, when at least any one of a plurality of commands is inputted; generating a code signal by encoding the plurality of commands, storing the code signal in a plurality of latch circuits, and generating a command code signal from the stored code signal after a second shifting time; and generating a plurality of internal commands by decoding the command code signal after shifting the summed command to a first shifting time.

In an embodiment, a command generation method may include: receiving a command from a plurality of commands; generating a code signal by encoding the received command from the plurality of commands, storing the code signal in a plurality of latch circuits, and generating a command code signal from the stored code signal after a second shifting time; generating an internal command by decoding the command code signal after shifting the received command to a first shifting time; and performing an internal operation depending on the internal command.

DETAILED DESCRIPTION

Hereinafter, a command generation method and a semiconductor device using the same will be described below with reference to the accompanying drawings through various examples of embodiments.

Various embodiments may be directed to storing code signals generated by encoding a plurality of commands, in a plurality of latch circuits, and generating internal commands from the stored code signals after a shifting time for shifting the plurality of commands.

According to the embodiments, by storing code signals generated by encoding a plurality of commands, in a plurality of latch circuits, and generating internal commands from the stored code signals after a shifting time, a shifting circuit for shifting the commands may be shared, whereby it may be possible to reduce an area.

Figure 1:
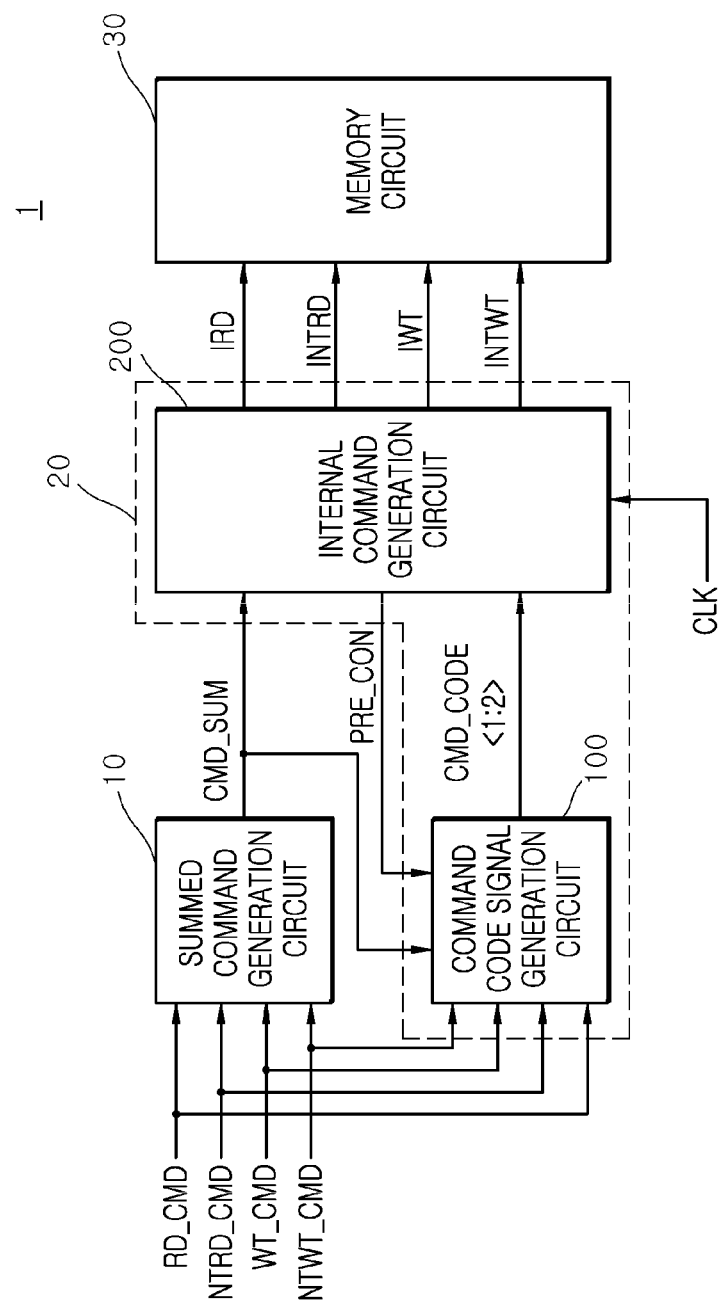
FIG. 1 is a block diagram illustrating a representation of an example of the configuration of a semiconductor device in accordance with an embodiment.

As shown in FIG. 1, a semiconductor device 1 in accordance with an embodiment may include a summed command generation circuit 10, a command recovery circuit 20 and a memory circuit 30.

The summed command generation circuit 10 may generate a summed command CMD_SUM from a first command RD_CMD, a second command NTRD_CMD, a third command WT_CMD and a fourth command NTWT_CMD. The summed command generation circuit 10 may generate the summed command CMD_SUM which is enabled, in the case where any one of the first command RD_CMD, the second command NTRD_CMD, the third command WT_CMD and the fourth command NTWT_CMD is inputted.

The command recovery circuit 20 may include a command code signal generation circuit 100 and an internal command generation circuit 200.

The command code signal generation circuit 100 may generate first and second command code signals CMD_CODE<1:2> by encoding the first command RD_CMD, the second command NTRD_CMD, the third command WT_CMD and the fourth command NTWT_CMD. The command code signal generation circuit 100 may store first and second code signals CODE<1:2> (see FIG. 3) which are generated by encoding the first command RD_CMD, the second command NTRD_CMD, the third command WT_CMD and the fourth command NTWT_CMD, by the summed command CMD_SUM. The command code signal generation circuit 100 may generate the first and second command code signals CMD_CODE<1:2> from the stored first and second code signals CODE<1:2> (see FIG. 3), by a pre-control signal PRE_CON.

The internal command generation circuit 200 may generate a first internal command IRD, a second internal command INTRD, a third internal command IWT and a fourth internal command INTWT by decoding the first and second command code signals CMD_CODE<1:2> after a first shifting time. The internal command generation circuit 200 may generate the pre-control signal PRE_CON which is enabled at a second shifting time, by shifting the summed command CMD_SUM. The first shifting time as a time for shifting the summed command CMD_SUM may be set to a time T6 shown in FIG. 12. The second shifting time as a time, previous to the first shifting time, for generating once the pulse of a clock CLK may be set to a time T4 shown in FIG. 12.

The command recovery circuit 20 configured as mentioned above may store the first and second code signals CODE<1:2> (see FIG. 3) which are generated by encoding the first command RD_CMD, the second command NTRD_CMD, the third command WT_CMD and the fourth command NTWT_CMD, depending on the summed command CMD_SUM, and may generate the first internal command IRD, the second internal command INTRD, the third internal command IWT and the fourth internal command INTWT by decoding the first and second command code signals CMD_CODE<1:2> generated from the first and second code signals CODE<1:2> (see FIG. 3), after the first shifting time.

The memory circuit 30 may perform an internal operation by receiving the first internal command IRD, the second internal command INTRD, the third internal command IWT and the fourth internal command INTWT. The memory circuit 30 may perform a read operation for a rank (not shown) selected among a plurality of ranks (not shown), by receiving the first internal command IRD. The memory circuit 30 may perform a non-target read operation for turning on the on-die termination circuits of a plurality of ranks (not shown) which do not perform a read operation, among the plurality of ranks, by receiving the second internal command INTRD. The memory circuit 30 may perform a write operation for a rank (not shown) selected among the plurality of ranks, by receiving the third internal command IWT. The memory circuit 30 may perform a non-target write operation for turning on the on-die termination circuits of a plurality of ranks (not shown) which do not perform a write operation, among the plurality of ranks, by receiving the fourth internal command INTWT. The commands and internal commands illustrated in the disclosure may be set to various commands and internal commands for controlling the operation of the memory circuit 30, depending on an embodiment.

Figure 2:
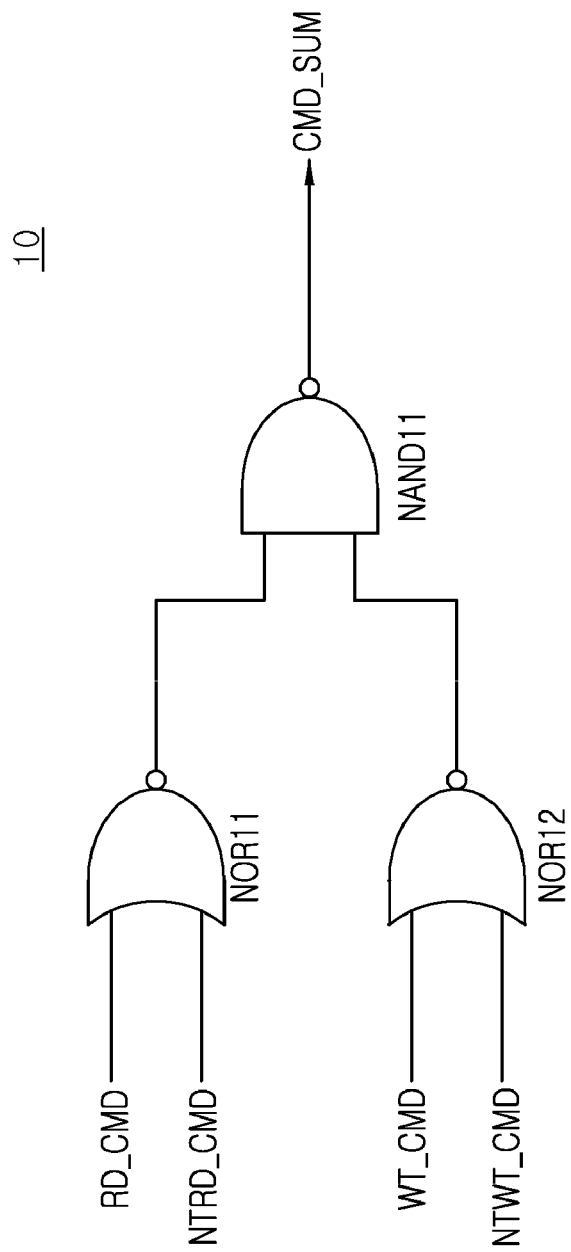
FIG. 2 is a circuit diagram illustrating a representation of an example of the configuration of the summed command generation circuit included in the semiconductor device shown in FIG. 1.

Referring to FIG. 2, the summed command generation circuit 10 may perform NOR and NAND logic operations and may be realized by, for example but not limited to, NOR gates NOR11 and NOR12 and a NAND gate NAND11.

The NOR gate NOR11 may generate an output signal of a logic low level in the case where any one of the first command RD_CMD and the second command NTRD_CMD is inputted at a logic high level.

The NOR gate NOR12 may generate an output signal of a logic low level in the case where any one of the third command WT_CMD and the fourth command NTWT_CMD is inputted at a logic high level.

The NAND gate NAND11 may generate the summed command CMD_SUM which is enabled to a logic high level, in the case where any one of the output signals of the NOR gate NOR11 and the NOR gate NOR12 is generated at the logic low level.

The summed command generation circuit 10 configured as mentioned above may generate the summed command CMD_SUM which is enabled to the logic high level, in the case where any one of the first command RD_CMD, the second command NTRD_CMD, the third command WT_CMD and the fourth command NTWT_CMD is inputted at the logic high level.

Figure 3:
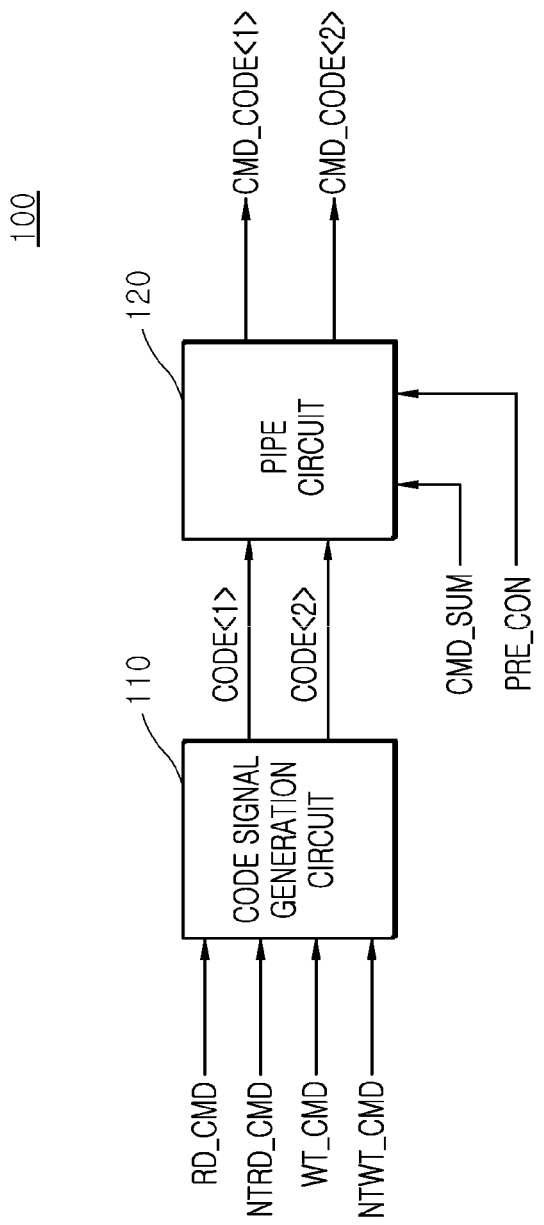
FIG. 3 is a block diagram illustrating a representation of an example of the configuration of the command code signal generation circuit included in the semiconductor device shown in FIG. 1.

Referring to FIG. 3, the command code signal generation circuit 100 may include a code signal generation circuit 110 and a pipe circuit 120.

The code signal generation circuit 110 may generate the first and second code signals CODE<1:2> by encoding the first command RD_CMD, the second command NTRD_CMD, the third command WT_CMD and the fourth command NTWT_CMD. The code signal generation circuit 110 may generate the first code signal CODE<1> of a logic low level and the second code signal CODE<2> of a logic low level in the case where the first command RD_CMD is inputted. The code signal generation circuit 110 may generate the first code signal CODE<1> of a logic high level and the second code signal CODE<2> of the logic low level in the case where the second command NTRD_CMD is inputted. The code signal generation circuit 110 may generate the first code signal CODE<1> of the logic low level and the second code signal CODE<2> of a logic high level in the case where the third command WT_CMD is inputted. The code signal generation circuit 110 may generate the first code signal CODE<1> of the logic high level and the second code signal CODE<2> of the logic high level in the case where the fourth command NTWT_CMD is inputted.

The pipe circuit 120 may store the first and second code signals CODE<1:2> in the case where the summed command CMD_SUM is inputted. The pipe circuit 120 may generate the first and second command code signals CMD_CODE<1:2> from the stored first and second code signals CODE<1:2> in the case where the pre-control signal PRE_CON is inputted.

Figure 4:
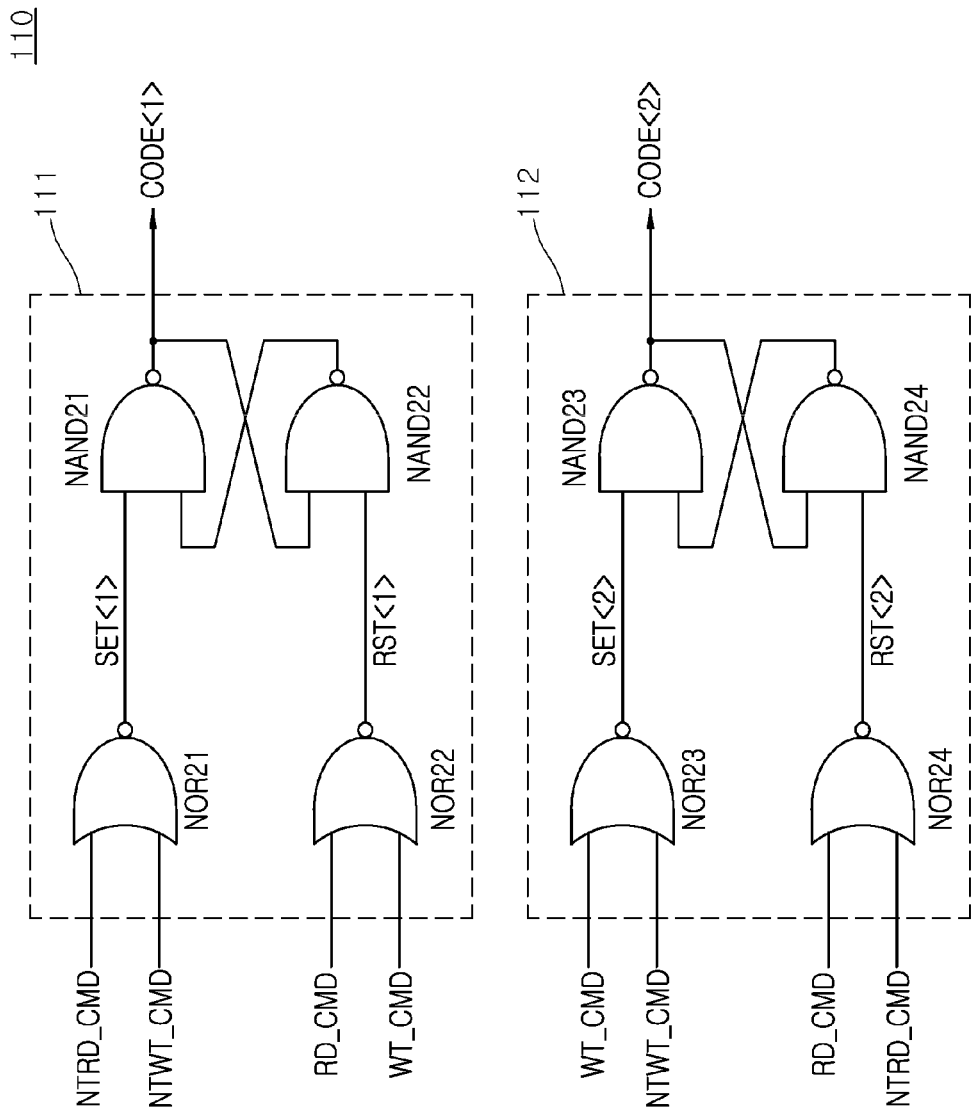
FIG. 4 is a circuit diagram illustrating a representation of an example of the configuration of the code signal generation circuit included in the command code signal generation circuit shown in FIG. 3.

Referring to FIG. 4, the code signal generation circuit 110 may include a first encoder 111 and a second encoder 112.

The first encoder 111 may perform NOR and NAND operations and may be realized by, for example but not limited to, NOR gates NOR21 and NOR22 and NAND gates NAND21 and NAND22.

The NOR gate NOR21 may generate a first set signal SET<1> which is enabled to a logic low level, in the case where any one of the second command NTRD_CMD and the fourth command NTWT_CMD is inputted at the logic high level.

The NOR gate NOR22 may generate a first reset signal RST<1> which is enabled to a logic low level, in the case where any one of the first command RD_CMD and the third command WT_CMD is inputted at the logic high level.

The NAND gates NAND21 and NAND22 may be realized as an SR latch, and may generate the first code signal CODE<1> of the logic high level in the case where the first set signal SET<1> is enabled to the logic low level. The NAND gates NAND21 and NAND22 may be realized as an SR latch, and may generate the first code signal CODE<1> of the logic low level in the case where the first reset signal RST<1> is enabled to the logic low level.

The second encoder 112 may perform NOR and NAND logic operations and may be realized by, for example but not limited to, NOR gates NOR23 and NOR24 and NAND gates NAND23 and NAND24.

The NOR gate NOR23 may generate a second set signal SET<2> which is enabled to a logic low level, in the case where any one of the third command WT_CMD and the fourth command NTWT_CMD is inputted at the logic high level.

The NOR gate NOR24 may generate a second reset signal RST<2> which is enabled to a logic low level, in the case where any one of the first command RD_CMD and the second command NTRD_CMD is inputted at the logic high level.

The NAND gates NAND23 and NAND24 may be realized as an SR latch, and may generate the second code signal CODE<2> of the logic high level in the case where the second set signal SET<2> is enabled to the logic low level. The NAND gates NAND23 and NAND24 may be realized as an SR latch, and may generate the second code signal CODE<2> of the logic low level in the case where the second reset signal RST<2> is enabled to the logic low level.

Figure 5:
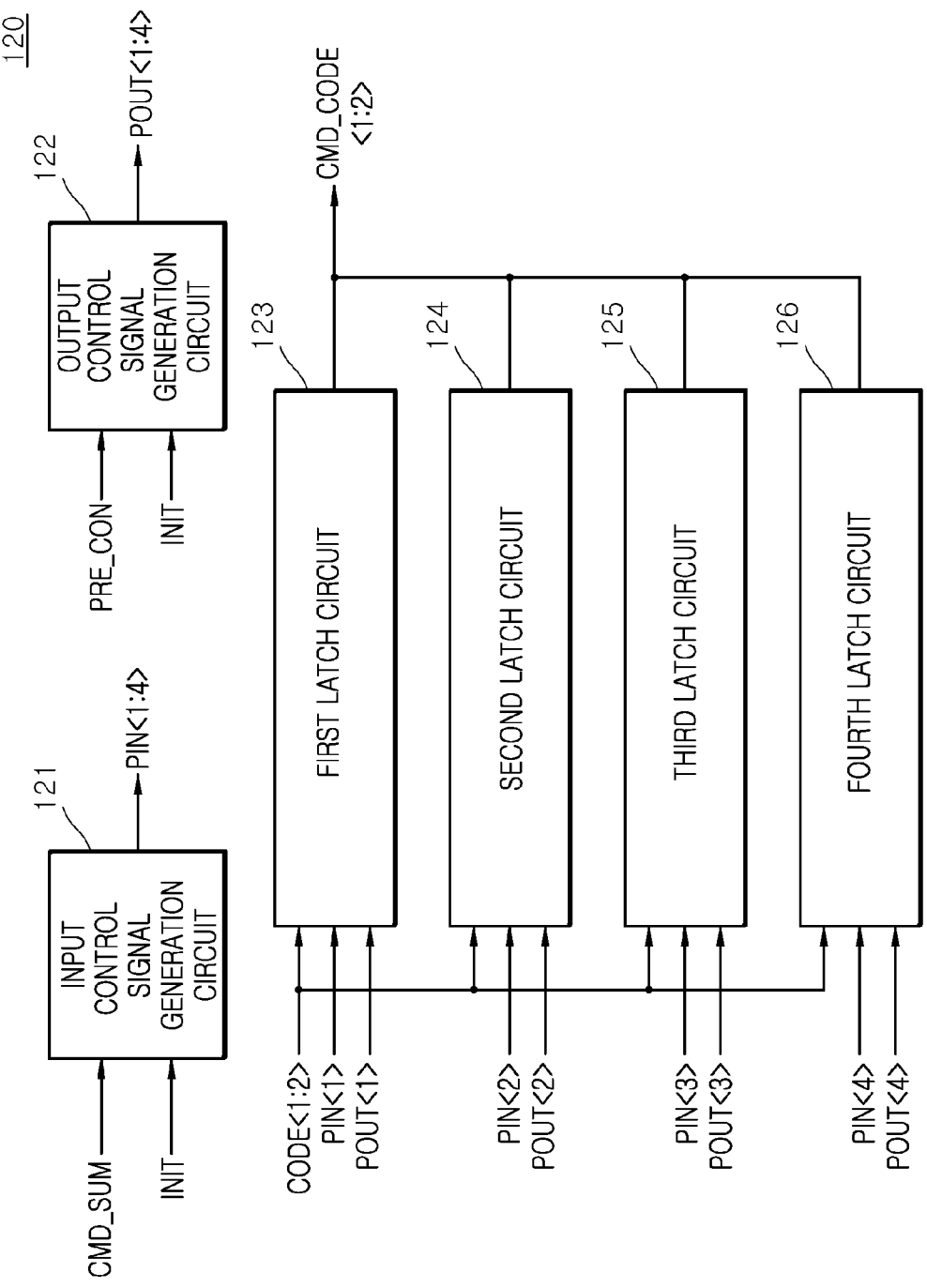
FIG. 5 is a block diagram illustrating a representation of an example of the configuration of the pipe circuit included in the command code signal generation circuit shown in FIG. 3.

Referring to FIG. 5, the pipe circuit 120 may include an input control signal generation circuit 121, an output control signal generation circuit 122, a first latch circuit 123, a second latch circuit 124, a third latch circuit 125 and a fourth latch circuit 126.

The input control signal generation circuit 121 may generate first to fourth input control signals PIN<1:4> which are sequentially enabled, depending on the summed command CMD_SUM. The input control signal generation circuit 121 may generate the first to fourth input control signals PIN<1:4> which are sequentially enabled, in the case where the summed command CMD_SUM is inputted at the logic high level. The input control signal generation circuit 121 may generate the first to fourth input control signals PIN<1:4> which are initialized, in the case where an initialization signal INIT is inputted at a logic high level.

The output control signal generation circuit 122 may generate first to fourth output control signals POUT<1:4> which are sequentially enabled, depending on the pre-control signal PRE_CON. The output control signal generation circuit 122 may generate the first to fourth output control signals POUT<1:4> which are sequentially enabled, in the case where the pre-control signal PRE_CON is inputted at a logic high level. The output control signal generation circuit 122 may generate the first to fourth output control signals POUT<1:4> which are initialized, in the case where the initialization signal INIT is inputted at the logic high level.

The first latch circuit 123 may store the first and second code signals CODE<1:2> in the case where the first input control signal PIN<1> is enabled to a logic high level, and may output the stored first and second code signals CODE<1:2> as the first and second command code signals CMD_CODE<1:2> in the case where the first output control signal POUT<1> is enabled to a logic high level.

The second latch circuit 124 may store the first and second code signals CODE<1:2> in the case where the second input control signal PIN<2> is enabled to a logic high level, and may output the stored first and second code signals CODE<1:2> as the first and second command code signals CMD_CODE<1:2> in the case where the second output control signal POUT<2> is enabled to a logic high level.

The third latch circuit 125 may store the first and second code signals CODE<1:2> in the case where the third input control signal PIN<3> is enabled to a logic high level, and may output the stored first and second code signals CODE<1:2> as the first and second command code signals CMD_CODE<1:2> in the case where the third output control signal POUT<3> is enabled to a logic high level.

The fourth latch circuit 126 may store the first and second code signals CODE<1:2> in the case where the fourth input control signal PIN<4> is enabled to a logic high level, and may output the stored first and second code signals CODE<1:2> as the first and second command code signals CMD_CODE<1:2> in the case where the fourth output control signal POUT<4> is enabled to a logic high level.

Figure 6:
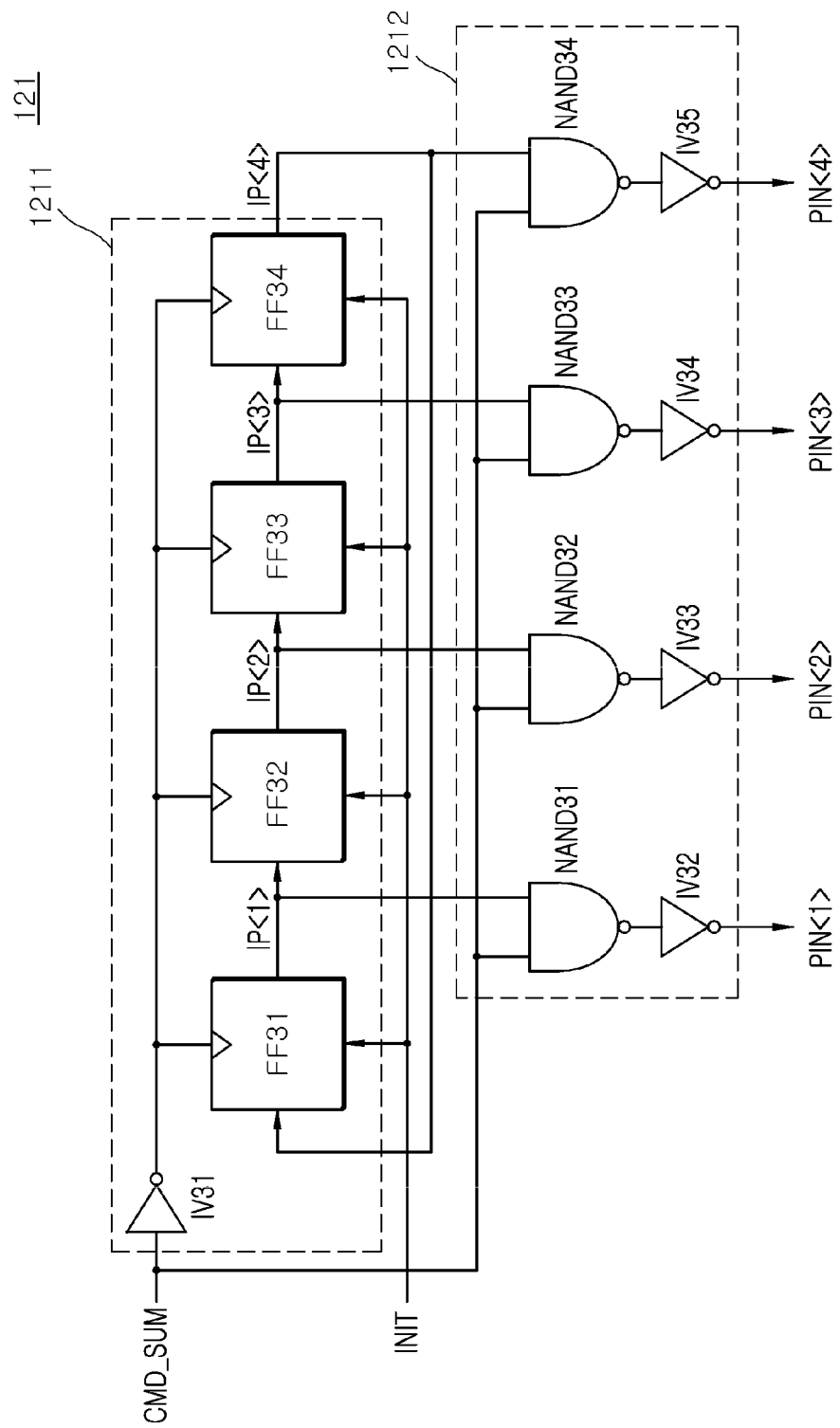
FIG. 6 is a diagram illustrating a representation of an example of the configuration of the input control signal generation circuit included in the pipe circuit shown in FIG. 5.

Referring to FIG. 6, the input control signal generation circuit 121 may include an internal pulse generation circuit 1211 and an input control signal output circuit 1212.

The internal pulse generation circuit 1211 may be realized by, for example but not limited to, an inverter IV31 and flip-flops FF31, FF32, FF33 and FF34.

The inverter IV31 may invert and buffer the summed command CMD_SUM, and output an output signal.

The flip-flop FF31 may generate a first internal pulse IP<1> which is initialized to a logic high level, in the case where the initialization signal INIT is enabled. The flip-flop FF31 may output a fourth internal pulse IP<4> as the first internal pulse IP<1>, in the case where the output signal of the inverter IV31 is a logic low level.

The flip-flop FF32 may generate a second internal pulse IP<2> which is initialized to a logic low level, in the case where the initialization signal INIT is enabled. The flip-flop FF32 may output the first internal pulse IP<1> as the second internal pulse IP<2>, in the case where the output signal of the inverter IV31 is the logic low level.

The flip-flop FF33 may generate a third internal pulse IP<3> which is initialized to a logic low level, in the case where the initialization signal INIT is enabled. The flip-flop FF33 may output the second internal pulse IP<2> as the third internal pulse IP<3>, in the case where the output signal of the inverter IV31 is the logic low level.

The flip-flop FF34 may generate a fourth internal pulse IP<4> which is initialized to a logic low level, in the case where the initialization signal INIT is enabled. The flip-flop FF34 may output the third internal pulse IP<3> as the fourth internal pulse IP<4>, in the case where the output signal of the inverter IV31 is the logic low level.

The initialization signal INIT may be set as a signal which is enabled in an initialization operation where the semiconductor device 1 first performs an operation.

The input control signal output circuit 1212 may perform NAND and inversion logic operations and may be realized by, for example but not limited to, NAND gates NAND31, NAND32, NAND33 and NAND34 and inverters IV32, IV33, IV34 and IV35.

The NAND gate NAND31 and the inverter IV32 may buffer the first internal pulse IP<1> and thereby generate the first input control signal PIN<1>, in the case where the summed command CMD_SUM is the logic high level.

The NAND gate NAND32 and the inverter IV33 may buffer the second internal pulse IP<2> and thereby generate the second input control signal PIN<2>, in the case where the summed command CMD_SUM is the logic high level.

The NAND gate NAND33 and the inverter IV34 may buffer the third internal pulse IP<3> and thereby generate the third input control signal PIN<3>, in the case where the summed command CMD_SUM is the logic high level.

The NAND gate NAND34 and the inverter IV35 may buffer the fourth internal pulse IP<4> and thereby generate the fourth input control signal PIN<4>, in the case where the summed command CMD_SUM is the logic high level.

Figure 7:
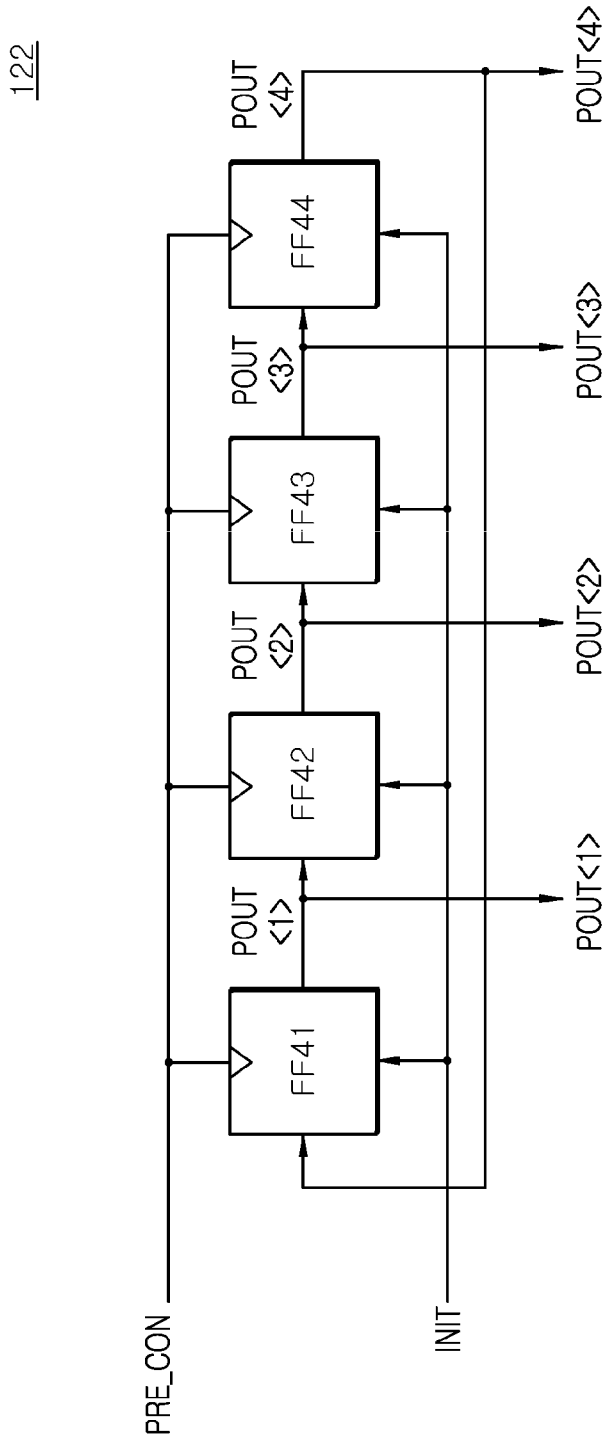
FIG. 7 is a diagram illustrating a representation of an example of the configuration of the output control signal generation circuit included in the pipe circuit shown in FIG. 5.

Referring to FIG. 7, the output control signal generation circuit 122 may be realized by flip-flops FF41, FF42, FF43 and FF44.

The flip-flop FF41 may generate the first output control signal POUT<1> which is initialized to a logic low level, in the case where the initialization signal INIT is enabled. The flip-flop FF41 may output the fourth output control signal POUT<4> as the first output control signal POUT<1>, in the case where the pre-control signal PRE_CON is the logic high level.

The flip-flop FF42 may generate the second output control signal POUT<2> which is initialized to a logic low level, in the case where the initialization signal INIT is enabled. The flip-flop FF42 may output the first output control signal POUT<1> as the second output control signal POUT<2>, in the case where the pre-control signal PRE_CON is the logic high level.

The flip-flop FF43 may generate the third output control signal POUT<3> which is initialized to a logic low level, in the case where the initialization signal INIT is enabled. The flip-flop FF43 may output the second output control signal POUT<2> as the third output control signal POUT<3>, in the case where the pre-control signal PRE_CON is the logic high level.

The flip-flop FF44 may generate the fourth output control signal POUT<4> which is initialized to a logic high level, in the case where the initialization signal INIT is enabled. The flip-flop FF44 may output the third output control signal POUT<3> as the fourth output control signal POUT<4>, in the case where the pre-control signal PRE_CON is the logic high level.

Figure 8:
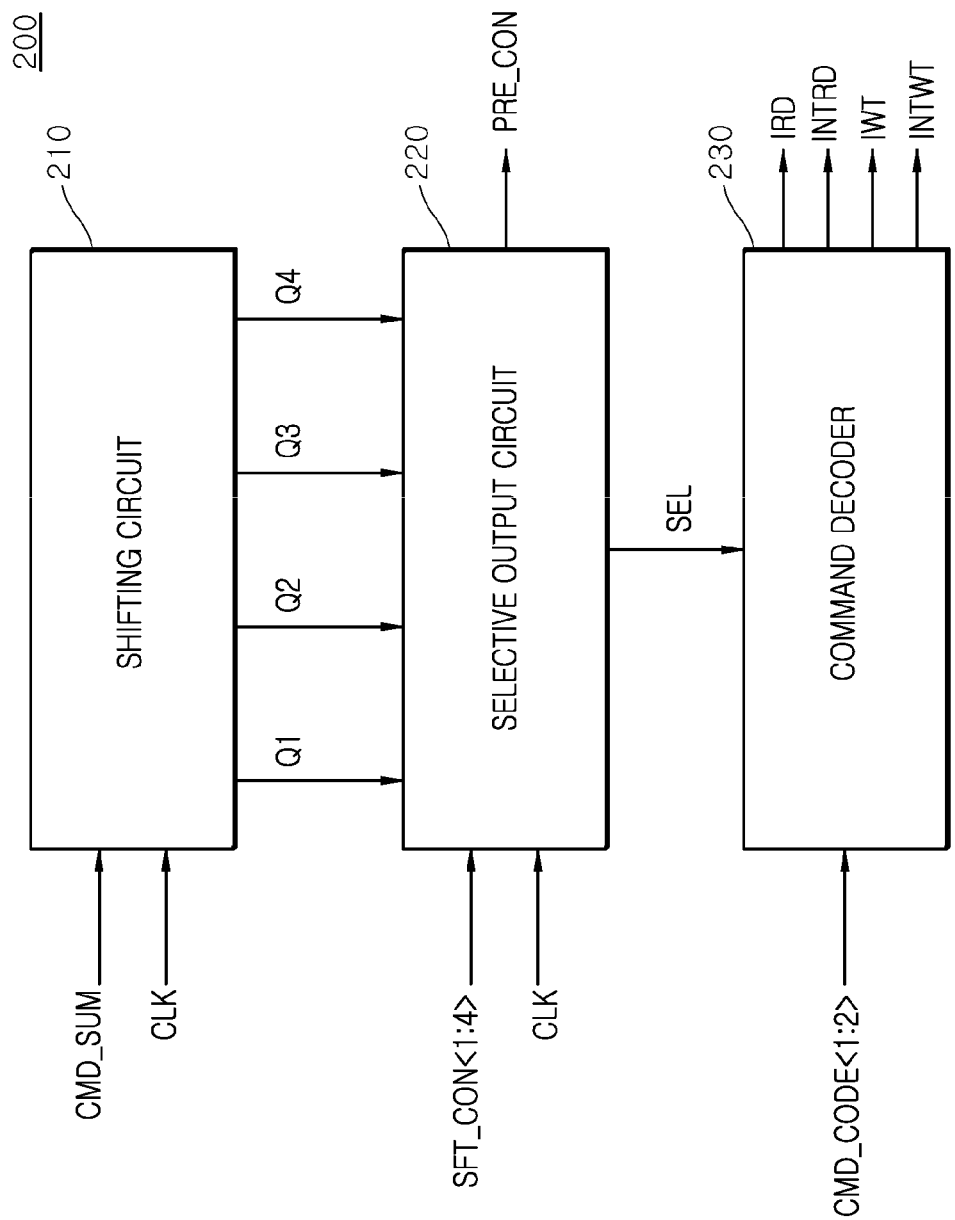
FIG. 8 is a block diagram illustrating a representation of an example of the configuration of the internal command generation circuit included in the semiconductor device shown in FIG. 1.

Referring to FIG. 8, the internal command generation circuit 200 may include a shifting circuit 210, a selective output circuit 220 and a command decoder 230.

The shifting circuit 210 may shift the summed command CMD_SUM in synchronization with the clock CLK and thereby generate first to fourth shifting signals Q1, Q2, Q3 and Q4 which are sequentially enabled. The shifting circuit 210 may shift the summed command CMD_SUM in synchronization with the rising edge of the clock CLK and thereby generate the first shifting signal Q1. The shifting circuit 210 may shift the first shifting signal Q1 in synchronization with the rising edge of the clock CLK and thereby generate the second shifting signal Q2. The shifting circuit 210 may shift the second shifting signal Q2 in synchronization with the rising edge of the clock CLK and thereby generate the third shifting signal Q3. The shifting circuit 210 may shift the third shifting signal Q3 in synchronization with the rising edge of the clock CLK and thereby generate the fourth shifting signal Q4.

The selective output circuit 220 may generate the pre-control signal PRE_CON from any one of the first to fourth shifting signals Q1, Q2, Q3 and Q4 depending on first to fourth shifting control signals SFT_CON<1:4>. The selective output circuit 220 may generate a select signal SEL by delaying the pre-control signal PRE_CON by one cycle of the clock CLK. The first to fourth shifting control signals SFT_CON<1:4> may be set as signals which are generated as signals for shifting the summed command CMD_SUM, in a mode register set (MRS). In order to shift the summed command CMD_SUM after a first shifting time, any one of the first to fourth shifting control signals SFT_CON<1:4> may be set to be enabled. One cycle of the clock CLK may be set as a time for a pulse included in the clock CLK to be generated once.

The command decoder 230 may decode the first and second command code signals CMD_CODE<1:2> in the case where the select signal SEL is enabled, and thereby generate the first internal command IRD, the second internal command INTRD, the third internal command IWT and the fourth internal command INTWT which are selectively enabled.

Figure 9:
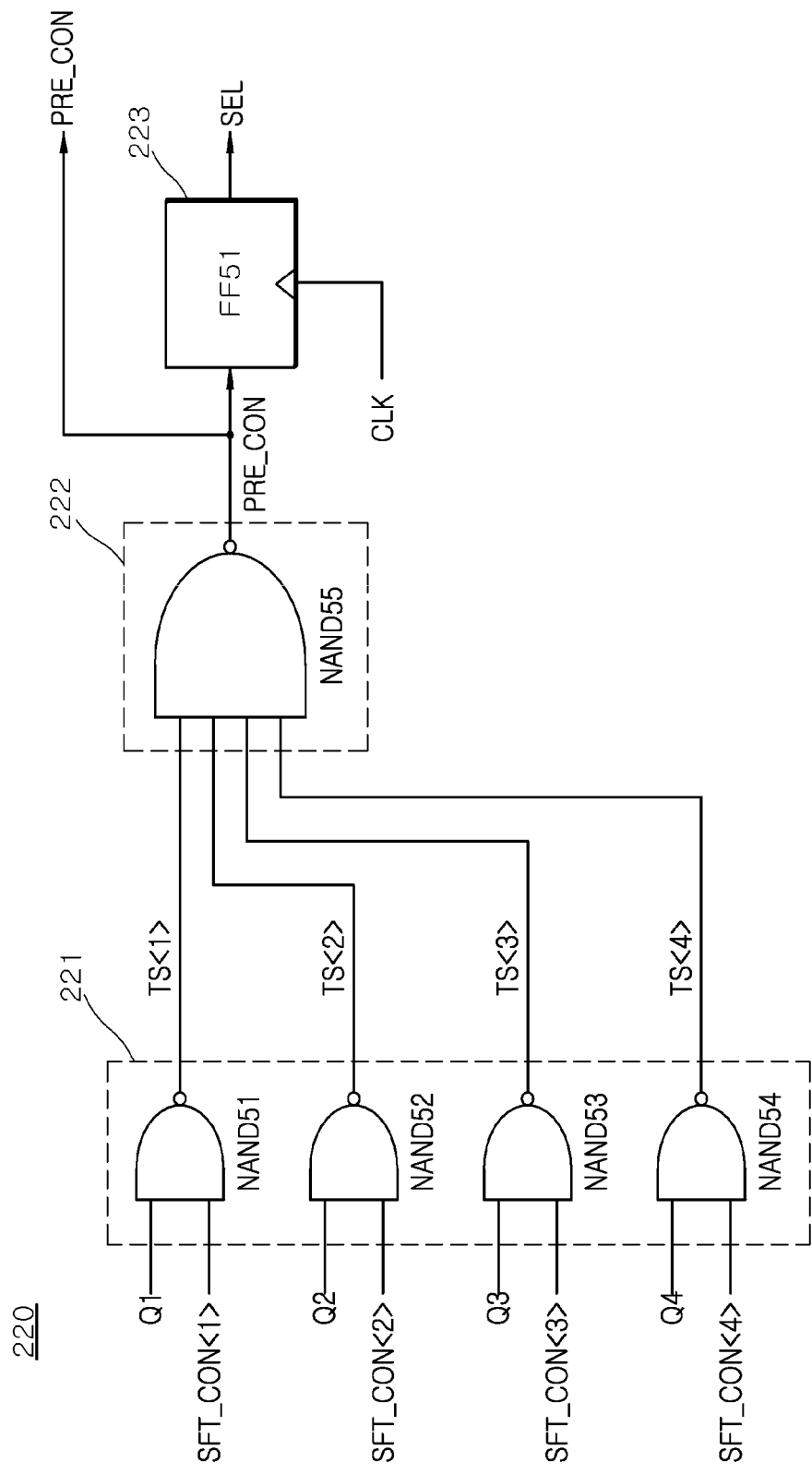
FIG. 9 is a diagram illustrating a representation of an example of the configuration of the selective output circuit included in the internal command generation circuit shown in FIG. 8.

Referring to FIG. 9, the selective output circuit 220 may include a transfer signal generation circuit 221, a pre-control signal generation circuit 222 and a select signal generation circuit 223.

The transfer signal generation circuit 221 may perform NAND logic operations and may be realized by, for example but not limited to, NAND gates NAND51, NAND52, NAND53 and NAND54.

The NAND gate NAND51 may invert and buffer the first shifting signal Q1 and thereby generate a first transfer signal TS<1> in the case where the first shifting control signal SFT_CON<1> is enabled to a logic high level. The NAND gate NAND51 may generate the first transfer signal TS<1> which is disabled to a logic high level, in the case where the first shifting control signal SFT_CON<1> is disabled to a logic low level.

The NAND gate NAND52 may invert and buffer the second shifting signal Q2 and thereby generate a second transfer signal TS<2> in the case where the second shifting control signal SFT_CON<2> is enabled to a logic high level. The NAND gate NAND52 may generate the second transfer signal TS<2> which is disabled to a logic high level, in the case where the second shifting control signal SFT_CON<2> is disabled to a logic low level.

The NAND gate NAND53 may invert and buffer the third shifting signal Q3 and thereby generate a third transfer signal TS<3> in the case where the third shifting control signal SFT_CON<3> is enabled to a logic high level. The NAND gate NAND53 may generate the third transfer signal TS<3> which is disabled to a logic high level, in the case where the third shifting control signal SFT_CON<3> is disabled to a logic low level.

The NAND gate NAND54 may invert and buffer the fourth shifting signal Q4 and thereby generate a fourth transfer signal TS<4> in the case where the fourth shifting control signal SFT_CON<4> is enabled to a logic high level. The NAND gate NAND54 may generate the fourth transfer signal TS<4> which is disabled to a logic high level, in the case where the fourth shifting control signal SFT_CON<4> is disabled to a logic low level.

The pre-control signal generation circuit 222 may perform a NAND logic operation and may be realized by, for example but not limited to, a NAND gate NAND55.

The pre-control signal generation circuit 222 may generate the pre-control signal PRE_CON which is enabled to the logic high level, in the case where any one of the first to fourth transfer signals TS<1:4> is enabled to a logic low level.

The select signal generation circuit 223 may be realized by a flip-flop FF51.

The select signal generation circuit 223 may generate the select signal SEL by delaying the pre-control signal PRE_CON by one cycle of the clock CLK.

Figure 10:
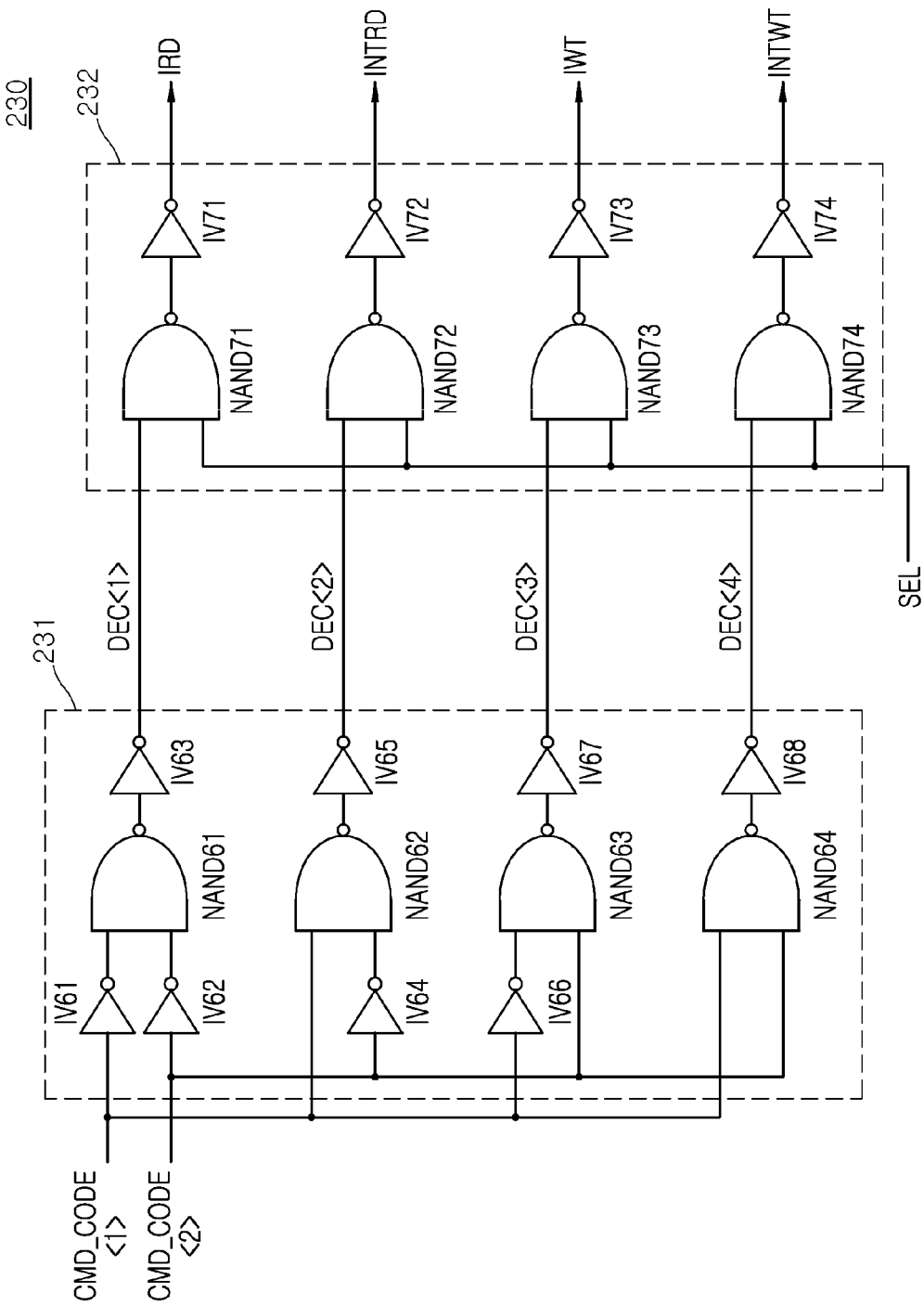
FIG. 10 is a circuit diagram illustrating a representation of an example of the configuration of the command decoder included in the internal command generation circuit shown in FIG. 8.

Referring to FIG. 10, the command coder 230 may include a decoding signal generation circuit 231 and a logic circuit 232.

The decoding signal generation circuit 231 may perform inversion and NAND logic operations and may be realized by, for example but not limited to, inverters IV61, IV62, IV63, IV64, IV65, IV66, IV67 and IV68 and NAND gates NAND61, NAND62, NAND63 and NAND64.

The decoding signal generation circuit 231 may generate a first decoding signal DEC<1> which is enabled to a logic high level, in the case where the first command code signal CMD_CODE<1> is a logic low level and the second command code signal CMD_CODE<2> is a logic low level.

The decoding signal generation circuit 231 may generate a second decoding signal DEC<2> which is enabled to a logic high level, in the case where the first command code signal CMD_CODE<1> is a logic high level and the second command code signal CMD_CODE<2> is the logic low level.

The decoding signal generation circuit 231 may generate a third decoding signal DEC<3> which is enabled to a logic high level, in the case where the first command code signal CMD_CODE<1> is the logic low level and the second command code signal CMD_CODE<2> is a logic high level.

The decoding signal generation circuit 231 may generate a fourth decoding signal DEC<4> which is enabled to a logic high level, in the case where the first command code signal CMD_CODE<1> is the logic high level and the second command code signal CMD_CODE<2> is the logic high level.

The logic circuit 232 may perform NAND and inversion logic operations and may be realized by, for example but not limited to, NAND gates NAND71, NAND72, NAND73 and NAND74 and inverters IV71, IV72, IV73 and IV74.

The logic circuit 232 may buffer the first decoding signal DEC<1> and thereby generate the first internal command IRD in the case where the select signal SEL is enabled to a logic high level. The logic circuit 232 may generate the first internal command IRD which is disabled to a logic low level, in the case where the select signal SEL is disabled to a logic low level.

The logic circuit 232 may buffer the second decoding signal DEC<2> and thereby generate the second internal command INTRD in the case where the select signal SEL is enabled to the logic high level. The logic circuit 232 may generate the second internal command INTRD which is disabled to a logic low level, in the case where the select signal SEL is disabled to the logic low level.

The logic circuit 232 may buffer the third decoding signal DEC<3> and thereby generate the third internal command IWT in the case where the select signal SEL is enabled to the logic high level. The logic circuit 232 may generate the third internal command IWT which is disabled to a logic low level, in the case where the select signal SEL is disabled to the logic low level.

The logic circuit 232 may buffer the fourth decoding signal DEC<4> and thereby generate the fourth internal command INTWT in the case where the select signal SEL is enabled to the logic high level. The logic circuit 232 may generate the fourth internal command INTWT which is disabled to a logic low level, in the case where the select signal SEL is disabled to the logic low level.

Figure 11:
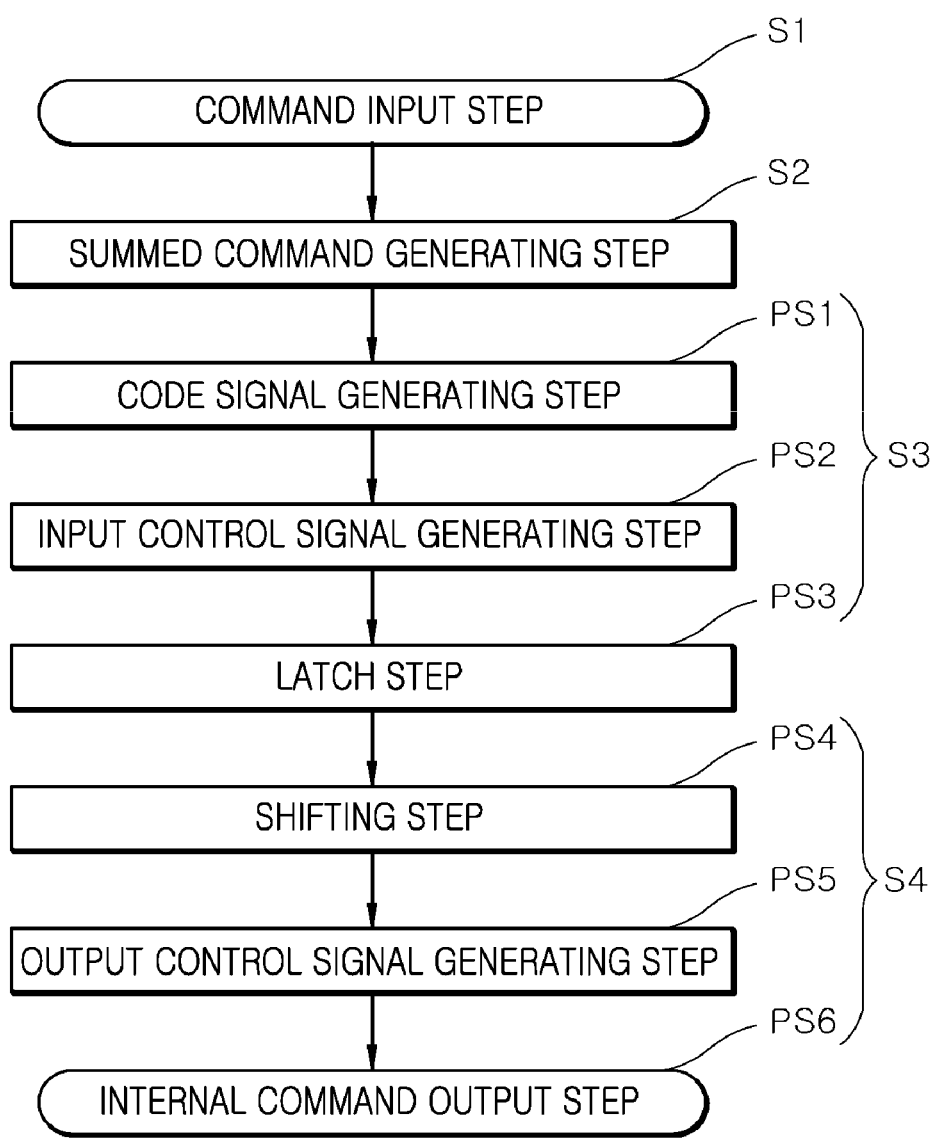
FIG. 11 is a representation of an example of a flow chart to assist in the explanation of a command generation method in accordance with an embodiment.

A command generation method in accordance with an embodiment will be described below with reference to FIG. 11.

When a command input step S1 is entered, any one of the first command RD_CMD, the second command NTRD_CMD, the third command WT_CMD and the fourth command NTWT_CMD is inputted at the logic high level.

When a summed command generating step S2 is entered, the summed command generation circuit 10 receives any one of the first command RD_CMD, the second command NTRD_CMD, the third command WT_CMD and the fourth command NTWT_CMD and thereby generates the summed command CMD_SUM of the logic high level.

A command storing step S3 may include a code signal generating step PS1, an input control signal generating step PS2 and a latch step PS3.

When the code signal generating step PS1 is entered, the code signal generation circuit 110 generates the first and second code signals CODE<1:2> by encoding the first command RD_CMD, the second command NTRD_CMD, the third command WT_CMD and the fourth command NTWT_CMD.

When the input control signal generating step PS2 is entered, the input control signal generation circuit 121 generates the first input control signal PIN<1> which is enabled to the logic high level, depending on the summed command CMD_SUM.

When the latch step PS3 is entered, the first latch circuit 123 stores the first and second code signals CODE<1:2> by the first input control signal PIN<1> of the logic high level.

An internal command generating step S4 may include a shifting step PS4, an output control signal generating step PS5 and an internal command output step PS6.

When the shifting step PS4 is entered, the shifting circuit 210 shifts the summed command CMD_SUM in synchronization with the clock CLK and thereby generates the first to fourth shifting signals Q1, Q2, Q3 and Q4 which are sequentially enabled.

The selective output circuit 220 generates the pre-control signal PRE_CON which is enabled to the logic high level, from any one of the first to fourth shifting signals Q1, Q2, Q3 and Q4 depending on the first to fourth shifting control signals SFT_CON<1:4>.

When the output control signal generating step PS5 is entered, the output control signal generation circuit 122 generates the first output control signal POUT<1> which is enabled to the logic high level, depending on the pre-control signal PRE_CON.

The first latch circuit 123 outputs the stored first and second code signals CODE<1:2> as the first and second command code signals CMD_CODE<1:2> by the first output control signal POUT<1> of the logic high level.

When the internal command output step PS6 is entered, the selective output circuit 220 generates the select signal SEL of the logic high level by delaying the pre-control signal PRE_CON by one cycle of the clock CLK.

Since the select signal SEL is enabled to the logic high level, the command decoder 230 decodes the first and second command code signals CMD_CODE<1:2>, and thereby generates any one of the first internal command IRD, the second internal command INTRD, the third internal command IWT and the fourth internal command INTWT. For example, in the case where the first command RD_CMD is inputted at the logic high level at the command input step S1, the command decoder 230 generates the first internal command IRD which is enabled to a logic high level.

Figure 12:
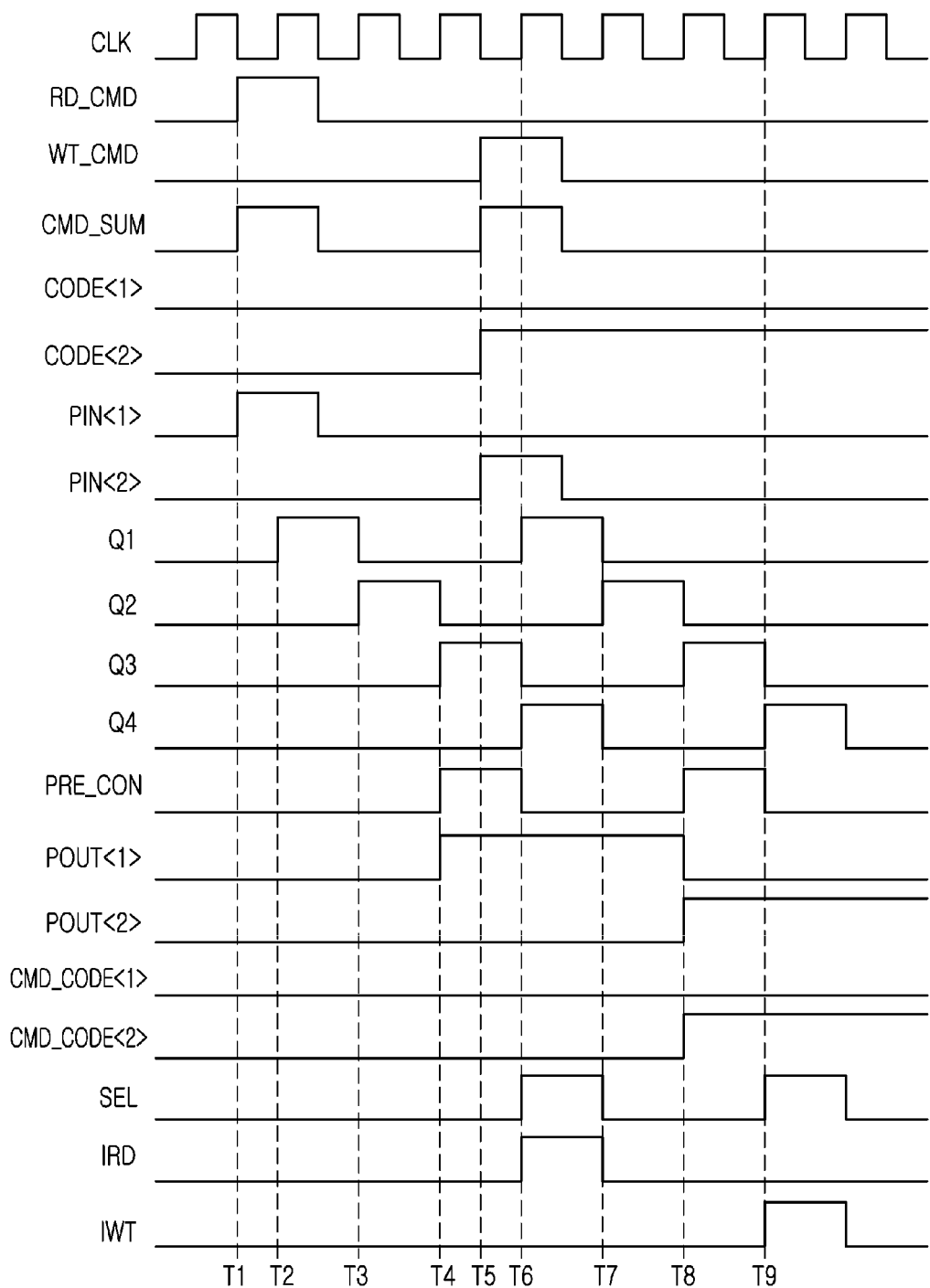
FIG. 12 is a representation of an example of a timing diagram to assist in the explanation of the operation of the semiconductor device in accordance with the embodiments.

The operation of the semiconductor device 1 in accordance with the embodiments will be described below with reference to FIG. 12, by taking as an example a case where, after the first command RD_CMD is inputted, the third command WT_CMD is inputted.

At a time T1, the first command RD_CMD is inputted at the logic high level.

The summed command generation circuit 10 generates the summed command CMD_SUM which is enabled to the logic high level, by summing the first command RD_CMD, the second command NTRD_CMD, the third command WT_CMD and the fourth command NTWT_CMD.

The code signal generation circuit 110 generates the first code signal CODE<1> of the logic low level and the second code signal CODE<2> of the logic low level since the first command RD_CMD is inputted at the logic high level.

The input control signal generation circuit 121 generates the first input control signal PIN<1> which is enabled to the logic high level, since the summed command CMD_SUM is inputted at the logic high level.

The first latch circuit 123 stores the first and second code signals CODE<1:2> since the first input control signal PIN<1> is enabled to the logic high level.

At a time T2, the shifting circuit 210 shifts the summed command CMD_SUM of the time T1 in synchronization with the clock CLK and thereby generates the first shifting signal Q1 which is enabled to a logic high level.

At a time T3, the shifting circuit 210 shifts the first shifting signal Q1 of the time T2 in synchronization with the clock CLK and thereby generates the second shifting signal Q2 which is enabled to a logic high level.

At a time T4, the shifting circuit 210 shifts the second shifting signal Q2 of the time T3 in synchronization with the clock CLK and thereby generates the third shifting signal Q3 which is enabled to a logic high level.

The selective output circuit 220 generates the pre-control signal PRE_CON of the logic high level from the third shifting signal Q3 by the third shifting control signal SFT_CON<3> of the logic high level.

The output control signal generation circuit 122 generates the first output control signal POUT<1> which is enabled to the logic high level, since the pre-control signal PRE_CON is inputted at the logic high level.

The first latch circuit 123 outputs the stored first and second code signals CODE<1:2> as the first and second command code signals CMD_CODE<1:2> since the first output control signal POUT<1> is enabled to the logic high level. At this time, the first command code signal CMD_CODE<1> is generated at the logic low level, and the second command code signal CMD_CODE<2> is generated at the logic low level.

At a time T5, the third command WT_CMD is inputted at the logic high level.

The summed command generation circuit 10 generates the summed command CMD_SUM which is enabled to the logic high level, by summing the first command RD_CMD, the second command NTRD_CMD, the third command WT_CMD and the fourth command NTWT_CMD.

The code signal generation circuit 110 generates the first code signal CODE<1> of the logic low level and the second code signal CODE<2> of the logic high level since the third command WT_CMD is inputted at the logic high level.

The input control signal generation circuit 121 generates the second input control signal PIN<2> which is enabled to the logic high level, since the summed command CMD_SUM is inputted at the logic high level.

The second latch circuit 124 stores the first and second code signals CODE<1:2> since the second input control signal PIN<2> is enabled to the logic high level.

At a time T6, the shifting circuit 210 shifts the summed command CMD_SUM of the time T5 in synchronization with the clock CLK and thereby generates the first shifting signal Q1 which is enabled to the logic high level.

The selective output circuit 220 generates the select signal SEL of the logic high level by delaying the pre-control signal PRE_CON of the time T4 by one cycle of the clock CLK.

Since the select signal SEL is enabled to the logic high level, the command decoder 230 decodes the first and second command code signals CMD_CODE<1:2> and thereby generates the first internal command IRD which is enabled to the logic high level.

The memory circuit 30 performs a read operation for a rank selected among a plurality of ranks (not shown), by receiving the first internal command IRD.

At a time T7, the shifting circuit 210 shifts the first shifting signal Q1 of the time T6 in synchronization with the clock CLK and thereby generates the second shifting signal Q2 which is enabled to the logic high level.

At a time T8, the shifting circuit 210 shifts the second shifting signal Q2 of the time T7 in synchronization with the clock CLK and thereby generates the third shifting signal Q3 which is enabled to the logic high level.

The selective output circuit 220 generates the pre-control signal PRE_CON of the logic high level from the third shifting signal Q3 by the third shifting control signal SFT_CON<3> of the logic high level.

The output control signal generation circuit 122 generates the second output control signal POUT<2> which is enabled to the logic high level, since the pre-control signal PRE_CON is inputted at the logic high level.

The second latch circuit 124 outputs the stored first and second code signals CODE<1:2> as the first and second command code signals CMD_CODE<1:2> since the second output control signal POUT<2> is enabled to the logic high level. At this time, the first command code signal CMD_CODE<1> is generated at the logic low level, and the second command code signal CMD_CODE<2> is generated at the logic high level.

At a time T9, the selective output circuit 220 generates the select signal SEL of the logic high level by delaying the pre-control signal PRE_CON of the time T8 by one cycle of the clock CLK.

Since the select signal SEL is enabled to the logic high level, the command decoder 230 decodes the first and second command code signals CMD_CODE<1:2> and thereby generates the third internal command IWT which is enabled to a logic high level.

The memory circuit 30 performs a write operation for a rank selected among the plurality of ranks, by receiving the third internal command IWT.

As is apparent from the above descriptions, in the semiconductor device in accordance with the embodiments of the disclosure, by storing code signals generated by encoding a plurality of commands, in a plurality of latch circuits, and generating internal commands from the stored code signals after a shifting time, a shifting circuit for shifting the commands may be shared, whereby it is possible to reduce an area.

Figure 13:
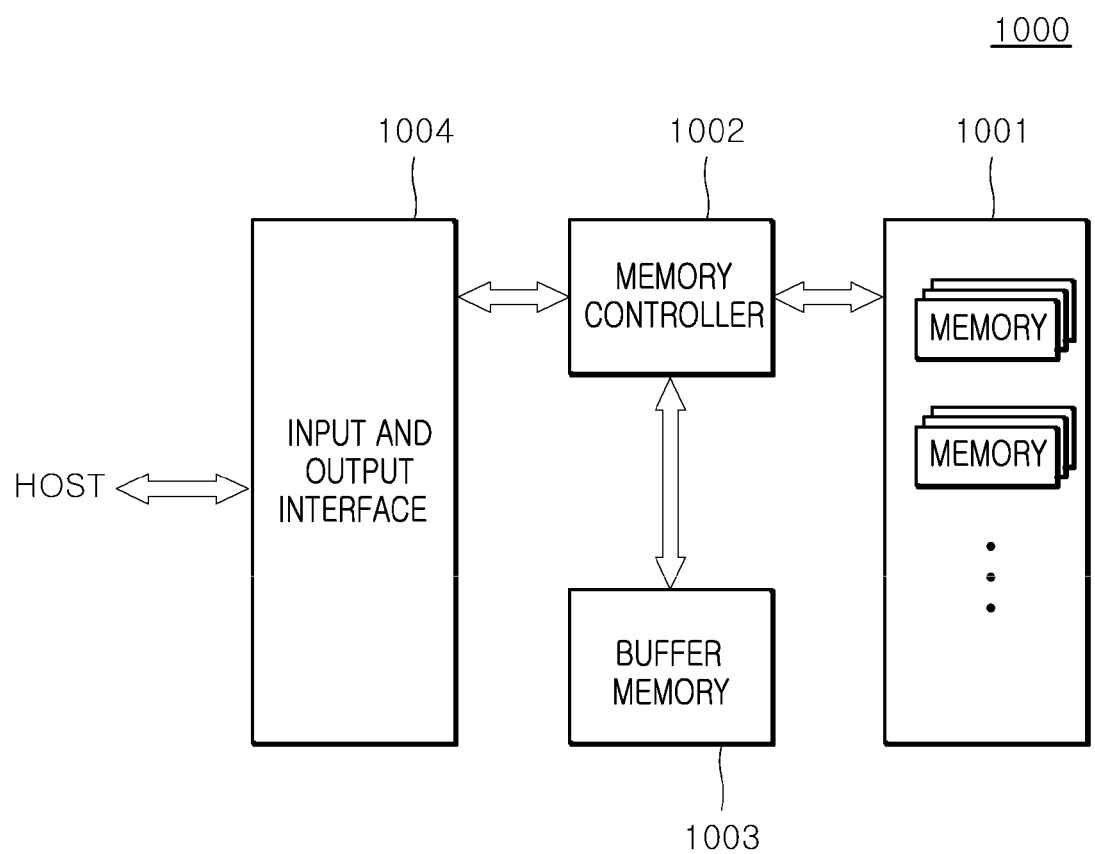
FIG. 13 is a block diagram illustrating a representation of an example of the configuration of a semiconductor device in accordance with the embodiments.

The semiconductor devices described above with reference to FIGS. 1 to 12 may be applied to an electronic system which includes a memory system, a graphic system, a computing system or a mobile system. For example, referring to FIG. 13, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor devices 1 shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 13, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the command generation method and the semiconductor device using the same described herein should not be limited based on the described embodiments.

What is claimed is:

1. A semiconductor device comprising:
    a command recovery circuit configured to receive a command from a plurality of commands, to store a code signal which is generated by encoding the received command from the plurality of commands, depending on the received command, and generate a plurality of internal commands by decoding a command code signal which is generated from the code signal after shifting the received command depending on a shifting control signal; and
    a memory circuit configured to perform an internal operation depending on the plurality of internal commands.

2. The semiconductor device according to claim 1, wherein the command code signal is generated at a time that is at least one cycle of a clock before a time when the plurality of internal commands are generated.

3. The semiconductor device according to claim 1, further comprising a summed command generation circuit configured to generate a summed command by summing the plurality of commands which include the received command,
    wherein the summed command generation circuit generates the summed command which is enabled, when any one of the plurality of commands is received by the summed command generation circuit.

4. The semiconductor device according to claim 1, further comprising a summed command generation circuit configured to generate a summed command by summing the plurality of commands which include the received command,
    wherein the plurality of commands comprise first to fourth commands, and the plurality of internal commands comprise first to fourth internal commands, and wherein the command recovery circuit comprises:
  a command code signal generation circuit configured to generate first and second code signals by encoding the first to fourth commands, store the first and second code signals depending on the summed command, and generate first and second command code signals from the first and second code signals depending on a pre-control signal; and
  an internal command generation circuit configured to generate the first to fourth internal commands by decoding the first and second command code signals after shifting the summed command.

5. The semiconductor device according to claim 4, wherein the command code signal generation circuit comprises:
  a code signal generation circuit configured to generate the first and second code signals by encoding the first to fourth commands; and
  a pipe circuit configured to store the first and second code signals when the summed command is inputted, and generate the first and second command code signals from the stored first and second code signals when the pre-control signal is inputted.

6. The semiconductor device according to claim 5, wherein the pipe circuit comprises:
  an input control signal generation circuit configured to generate first and second input control signals which are sequentially enabled, depending on the summed command;
  an output control signal generation circuit configured to generate first and second output control signals which are sequentially enabled, depending on the pre-control signal;
  a first latch circuit configured to store the first and second code signals based on the first input control signal, and output the stored first and second code signals as the first and second command code signals based on the first output control signal; and
  a second latch circuit configured to store the first and second code signals based on the second input control signal, and output the stored first and second code signals as the first and second command code signals based on the second output control signal.

7. The semiconductor device according to claim 4, wherein the internal command generation circuit comprises:
  a shifting circuit configured to generate first to fourth shifting signals by shifting the summed command;
  a selective output circuit configured to generate the pre-control signal from any one of the first to fourth shifting signals depending on first to fourth shifting control signals, and generate a select signal by delaying the pre-control signal by one cycle of the clock; and
  a command decoder configured to generate the first to fourth internal commands by decoding the first and second command code signals when the select signal is inputted.

8. A semiconductor device comprising:
  a summed command generation circuit configured to generate a summed command by summing first to fourth commands;
  a command code signal generation circuit configured to generate first and second code signals by encoding the first to fourth commands, store the first and second code signals by the summed command, and generate first and second command code signals from the first and second code signals after a second shifting time; and
  an internal command generation circuit configured to generate first to fourth internal commands by decoding the first and second command code signals, after shifting the summed command to a first shifting time.

9. The semiconductor device according to claim 8, wherein the summed command is a signal which is enabled, when any one of the first to fourth commands is inputted.

10. The semiconductor device according to claim 8, wherein the command code signal generation circuit comprises:
  a code signal generation circuit configured to generate the first and second code signals by encoding the first to fourth commands; and
  a pipe circuit configured to store the first and second code signals when the summed command is inputted, and generate the first and second command code signals from the stored first and second code signals when a pre-control signal is inputted.

11. The semiconductor device according to claim 10, wherein the pre-control signal is a signal which is enabled after the second shifting time.

12. The semiconductor device according to claim 10, wherein the pipe circuit comprises:
  an input control signal generation circuit configured to generate first and second input control signals which are sequentially enabled, depending on the summed command;
  an output control signal generation circuit configured to generate first and second output control signals which are sequentially enabled, depending on the pre-control signal;
  a first latch circuit configured to store the first and second code signals based on the first input control signal, and output the stored first and second code signals as the first and second command code signals based on the first output control signal; and
  a second latch circuit configured to store the first and second code signals based on the second input control signal, and output the stored first and second code signals as the first and second command code signals based on the second output control signal.

13. The semiconductor device according to claim 8, wherein the internal command generation circuit comprises:
  a shifting circuit configured to generate first to fourth shifting signals by shifting the summed command;
  a selective output circuit configured to generate the pre-control signal which is enabled after the second shifting time, from any one of the first to fourth shifting signals depending on first to fourth shifting control signals, and generate a select signal which is enabled after the first shifting time, by delaying the pre-control signal by one cycle of a clock; and
  a command decoder configured to generate the first to fourth internal commands by decoding the first and second command code signals when the select signal is inputted.

14. The semiconductor device according to claim 13, wherein the selective output circuit comprises:
  a transfer signal generation circuit configured to generate first to fourth transfer signals which are selectively enabled, from the first to fourth shifting signals depending on the first to fourth shifting control signals;
  a pre-control signal generation circuit configured to generate the pre-control signal which is enabled, when any one of the first to fourth transfer signals is enabled; and a select signal generation circuit configured to generate the select signal by delaying the pre-control signal by one cycle of the clock.

15. The semiconductor device according to claim 13, wherein the command decoder comprises:
a decoding signal generation circuit configured to generate first to fourth decoding signals which are selectively enabled, depending on a logic level combination of the first and second command code signals; and
a logic circuit configured to generate the first to fourth internal commands which are selectively enabled, from the first to fourth decoding signals, when the select signal is enabled.

16. A command generation method comprising:
generating a summed command which is enabled, when at least any one of a plurality of commands is inputted;
generating a code signal by encoding the plurality of commands, storing the code signal in a plurality of latch circuits, and generating a command code signal from the stored code signal after a second shifting time; and
generating a plurality of internal commands by decoding the command code signal after shifting the summed command to a first shifting time.

17. The method according to claim 16, wherein the generation of the code signal and the storage of the code signal comprises:
generating the code signal by encoding the plurality of commands;
generating input control signals which are sequentially enabled, based on the summed command; and
storing the code signal in the plurality of latch circuits depending on the input control signals.

18. The method according to claim 16, wherein the generation of the plurality of internal commands comprises:
generating a pre-control signal which is enabled after the second shifting time, by shifting the summed command, and generating a select signal which is enabled after the first shifting time;
generating output control signals which are sequentially enabled, based on the pre-control signal; and
outputting the code signal stored in the plurality of latch circuits, as the command code signal, depending on the output control signals, and generating the plurality of internal commands by decoding the command code signal when the select signal is enabled.

* * * * *